(12) United States Patent
Tsai et al.

(10) Patent No.: US 10,325,914 B2
(45) Date of Patent: Jun. 18, 2019

(54) SEMICONDUCTOR DEVICE HAVING STRAIN MODULATOR IN INTERLAYER DIELECTRIC LAYER

(71) Applicant: Taiwan Semiconductor Manufacturing Co., Ltd., Hsinchu (TW)

(72) Inventors: Shang-Chi Tsai, New Taipei (TW); Kang-Min Kuo, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/057,838

(22) Filed: Aug. 8, 2018

(65) Prior Publication Data

US 2018/0350814 A1 Dec. 6, 2018

Related U.S. Application Data

(62) Division of application No. 14/961,900, filed on Dec. 8, 2015, now Pat. No. 10,062,695.

(51) Int. Cl.

| *H01L 29/66*   | (2006.01) |
| *H01L 27/092*  | (2006.01) |
| *H01L 21/266*  | (2006.01) |
| *H01L 21/3115* | (2006.01) |
| *H01L 21/8238* | (2006.01) |
| *H01L 29/78*   | (2006.01) |
| *H01L 21/265*  | (2006.01) |

(52) U.S. Cl.
CPC ........ *H01L 27/0924* (2013.01); *H01L 21/265* (2013.01); *H01L 21/266* (2013.01); *H01L 21/31155* (2013.01); *H01L 21/823807* (2013.01); *H01L 21/823821* (2013.01); *H01L 21/823828* (2013.01); *H01L 27/092* (2013.01); *H01L 29/66545* (2013.01); *H01L 29/7843* (2013.01)

(58) Field of Classification Search
CPC ............... H01L 21/266; H01L 21/3115; H01L 21/31155; H01L 21/823807; H01L 21/823821; H01L 21/823828; H01L 29/66; H01L 29/66545; H01L 29/7843; H01L 29/785; H01L 29/66795
USPC ................................................ 438/199, 275
See application file for complete search history.

(56) References Cited

U.S. PATENT DOCUMENTS

| 9,577,102 B1* | 2/2017 | Hsiao ................... H01L 29/7851 |
| 2007/0096149 A1* | 5/2007 | Liu ................. H01L 21/823807 257/192 |
| 2017/0133509 A1* | 5/2017 | Hsiao ................... H01L 29/7851 |
| 2017/0365712 A1* | 12/2017 | Bu ....................... H01L 29/7827 |

* cited by examiner

*Primary Examiner* — Jami Valentine Miller
(74) *Attorney, Agent, or Firm* — JCIPRNET

(57) ABSTRACT

A semiconductor device and a manufacturing method thereof are provided. The semiconductor device includes a substrate, a metal-oxide-semiconductor (MOS) transistor, and a dielectric layer. The MOS transistor includes a gate structure formed over the substrate. The dielectric layer is formed aside the gate structure, and the dielectric layer is doped with a strain modulator. An effective lattice constant of the dielectric layer doped with the strain modulator is different from an original lattice constant of the dielectric layer prior to be doped with the strain modulator, wherein the strain modulator at least comprises silicon.

20 Claims, 12 Drawing Sheets

SEMICONDUCTOR DEVICE HAVING STRAIN MODULATOR IN INTERLAYER DIELECTRIC LAYER

CROSS-REFERENCE TO RELATED APPLICATION

This application is a divisional application of U.S. application Ser. No. 14/961,900, filed on Dec. 8, 2015, now allowed. The entirety of the above-mentioned patent application is hereby incorporated by reference herein and made a part of the specification.

BACKGROUND

The semiconductor integrated circuit (IC) industry has experienced rapid growth. Over the course of this growth, functional density of the devices has generally increased by the device feature size.

This scaling down process generally provides benefits by increasing production efficiency, lower costs, and/or improving performance. Such scaling down has also increased the complexities of processing and manufacturing ICs and, for these advances to be realized similar developments in IC fabrication are needed.

DETAILED DESCRIPTION

Figure 1:
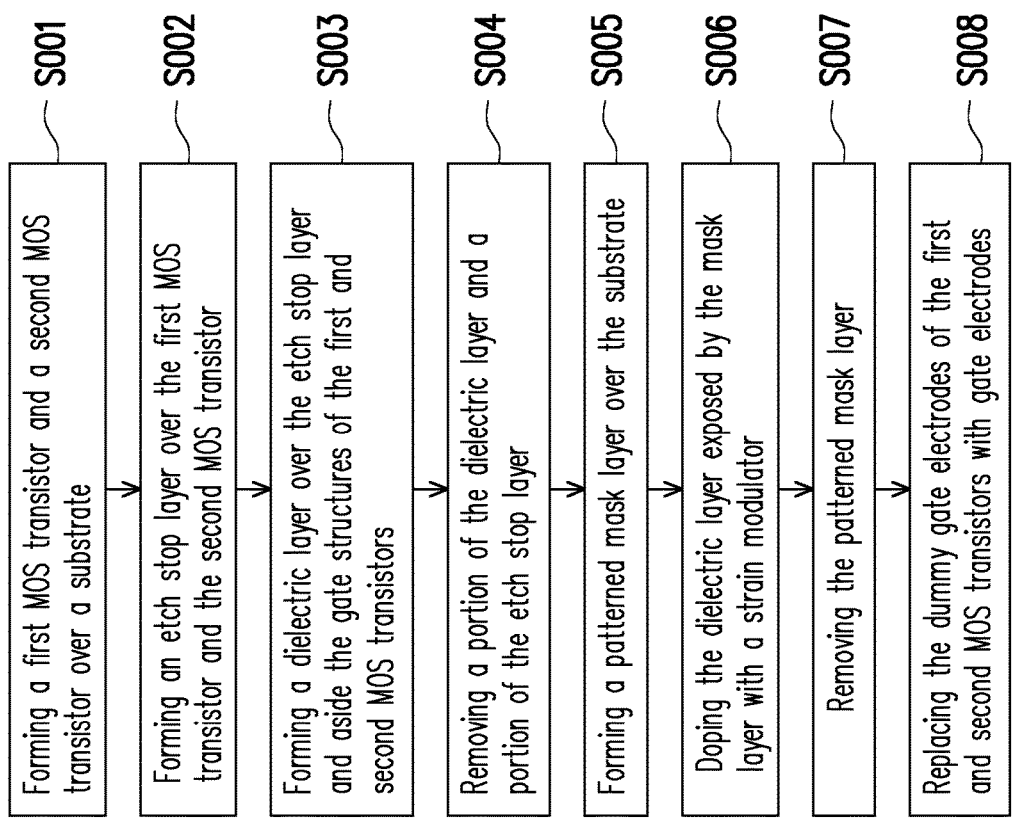
FIG. 1 is a flowchart illustrating a manufacturing method of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart illustrating a manufacturing method of a semiconductor device according to some embodiments of the disclosure. FIG. 2A through FIG. 2F are schematic cross-sectional views illustrating a manufacturing process of a semiconductor device according to first embodiment of the disclosure.

Figure 2A:
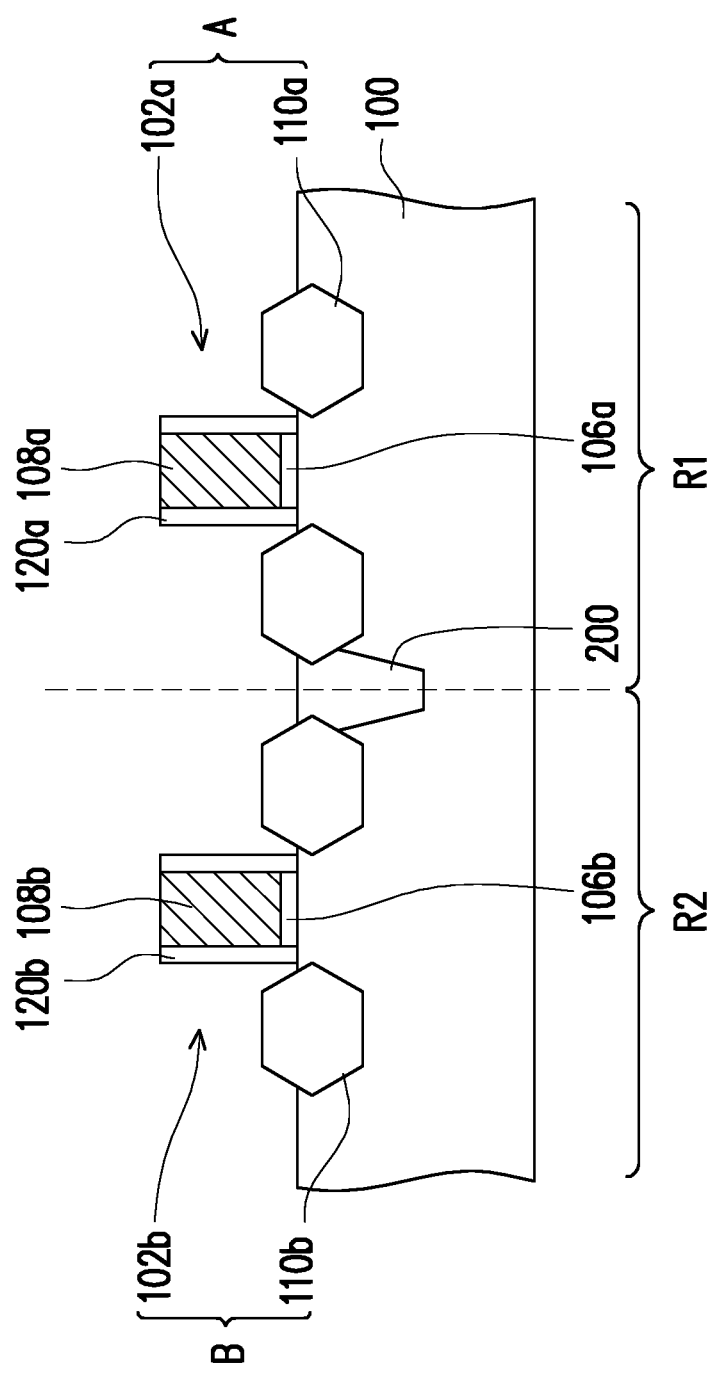
FIG. 2A through FIG. 2F are schematic cross-sectional views illustrating a manufacturing process of a semiconductor device according to first embodiment of the disclosure.

Referring to FIG. 1 and FIG. 2A simultaneously, in step S001, a first metal-oxide semiconductor (MOS) transistor A and a second MOS transistor B are formed over a substrate 100. In some embodiments, the first MOS transistor A is a first planar MOSFET, and the second MOS transistor B is a second planar MOSFET. In alternative embodiments, the first MOS transistor A is a first FinFET, and the second MOS transistor B is a second FinFET. In the first embodiment, the first MOS transistor A and the second MOS transistor B shown in FIG. 2A through FIG. 2F are described as first and second planar MOSFETs.

The substrate 100 is a planar substrate or a bulk substrate. The substrate 100 is divided into a first region R1, a second region R2, and a third region R3. The first MOS transistor A is formed in the first region R1 and the second MOS transistor B is formed in the second region R2. An exemplary material of the substrate 100 includes silicon, an alloy semiconductor such as silicon germanium, silicon germanium carbide, gallium arsenic phosphide, or gallium indium phosphide, or other semiconductor materials. In addition, substrate 100 may be a semiconductor on insulator such as silicon on insulator (SOI) or silicon on sapphire. Alternatively or additionally, substrate 100 includes other elementary semiconductor materials such as germanium, gallium arsenic, or other suitable semiconductor materials. In some embodiments, substrate 100 further includes other features such as various doped regions, a buried layer, and/or an epitaxy layer. For instances, the substrate 100 may include various doped regions depending on design requirements (e.g., p-type wells or n-type wells). The doped regions are doped with p-type dopants, such as boron or $BF_2$, and/or n-type dopants, such as phosphorus or arsenic. Moreover, the doped regions may be formed directly on the substrate 100, in a P-well structure, in an N-well structure, in a dual-well structure, or using a raised structure.

Moreover, substrate 100 also includes isolation regions 200, which are formed to isolate the first MOS transistor A and the second MOS transistor B. The isolation regions 200 utilize isolation technology, such as local oxidation of silicon (LOCOS) or shallow trench isolation (STI) to electrically isolate the various regions. If the isolation regions are made of STIs, the STI region comprises silicon oxide, silicon nitride, silicon oxynitride, other suitable materials, or a combination thereof. In some examples, the filled trench has a multi-layer structure such as a thermal oxide liner layer filled with silicon nitride or silicon oxide.

The first MOS transistor A includes a first gate structure 102a and first doped source and drain (S/D) regions 110a. Similarly, the second MOS transistor B includes a second gate structure 102b and second doped source and drain (S/D) regions 110b. In some embodiments, the first MOS transistor A and the second MOS transistor B are similar. Nevertheless, the dopant type implanted into the first doped S/D regions 110a and the second doped S/D regions 110b are different. In other words, the first MOS transistor A and the second MOS transistor B are of different conductive types. In detail, the semiconductor substrate 100 includes various active regions, such as regions configured for NMOS transistors and regions configured for PMOS transistors. That is, substrate 100 has dopant regions and epitaxial layers formed in the first doped S/D regions 110a and the second doped S/D regions 110b. In some embodiments, the first doped S/D regions 110a are doped with p-type dopants and the second doped S/D regions 110b are doped with n-type dopants. Based on these dopant types, the first MOS transistor A is a PMOSFET, and the second MOS transistor B is a NMOSFET. In alternative embodiments, the types of the dopants are interchanged to render opposite conductive type MOS transistors. It should be noted that the dopant in some embodiments are doped into the S/D regions through ion implantation. Alternatively, in some other embodiments, part of the substrate 100 is removed through etching or other suitable processes and the dopants are formed in the hollowed area through epitaxy growth. Specifically, the epitaxial layers include SiGe, SiC, or other suitable materials. It is understood that the semiconductor device structure may be formed by CMOS technology processing, and thus some processes are not described in detail herein.

In some embodiments, the first gate structure 102a includes a first gate dielectric layer 106a, a first gate electrode 108a, and first spacers 120a. Similarly, the second gate structure 102b includes a second gate dielectric layer 106b, a second gate electrode 108b, and second spacers 120b. In some embodiments, the first gate structure 102a and the second gate structure 102b are similar or identical. In some other embodiments, the elements in the second gate structure 102b are different from the elements in the first gate structure 102a. It should be noted that the detail described below with respect to the elements of the first gate structure 102a may also apply to the elements of the second gate structure 102b, and thus the description of the elements in the second gate structure 102b are omitted.

The first gate dielectric layer 106a and the first gate electrode 108a are formed over the substrate 100 in sequential order from bottom to top. The first gate dielectric layer 106a includes silicon oxide, silicon nitride, silicon oxynitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the first gate dielectric layer 106a is a high-k dielectric layer with a thickness in the range of about 10 to 30 angstroms. The first gate dielectric layer 106a is formed using a suitable process such as atomic layer deposition (ALD), chemical vapor deposition (CVD), physical vapor deposition (PVD), flowable chemical vapor deposition (FCVD), thermal oxidation, UV-ozone oxidation, or a combination thereof.

In some embodiment, the first gate electrode 108a serves as a dummy gate electrode, and the first gate electrode 108a is made of polysilicon. A metal gate (or called "replacement gate") would replace the dummy gate electrode in subsequent steps. The replacing step would be discussed in greater detail later.

Referring to FIG. 2A, the first spacers 120a are formed over sidewalls of the first gate electrode 108a. The first spacers 120a is formed of silicon oxide, silicon nitride, silicon oxynitride, silicon carbide, fluoride-doped silicate glass (FSG), low-k dielectric materials, or a combination thereof. It should be noted that the low-k dielectric materials are generally dielectric materials having a dielectric constant lower than 3.9. The first spacers 120a may have a multi-layer structure which includes one or more liner layers. The liner layer includes a dielectric material such as silicon oxide, silicon nitride, and/or other suitable materials. The formation of the first spacers 120 and the second spacers 120b can be achieved by depositing suitable dielectric material and anisotropically etching off the dielectric material.

Figure 2B:
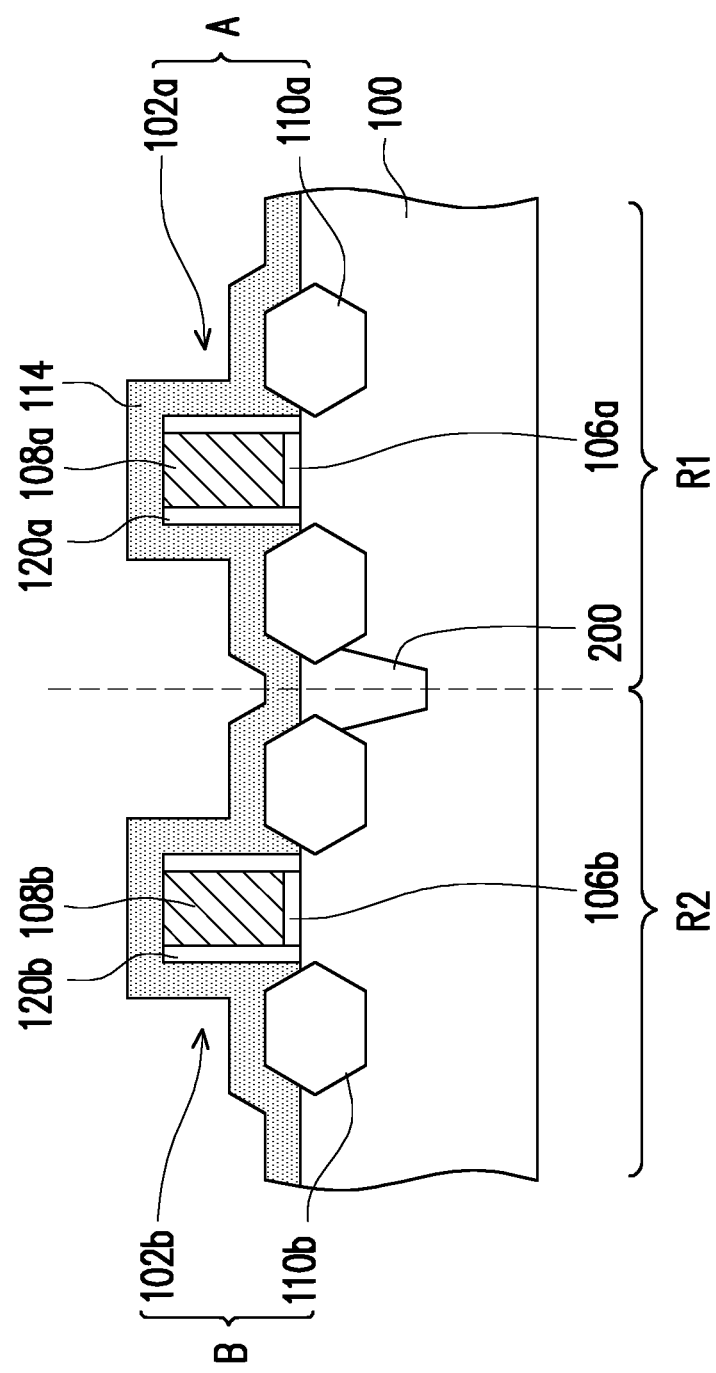

Referring to FIG. 1 and FIG. 2B simultaneously, in step S002, an etch stop layer 114 is formed over the first MOS transistor A and the second MOS transistor B. Specifically, the etch stop layer 114 is formed to overlay the first MOS transistor A and the second MOS transistor B, as illustrated in FIG. 2B. In some embodiments, the etch stop layer 114 is a contact etch stop layer (CESL). The etch stop layer 114 includes silicon nitride, carbon-doped silicon nitride, or a combination thereof. In some embodiments, the etch stop layer 114 is deposited using CVD, high density plasma (HDP) CVD, sub-atmospheric CVD (SACVD), molecular layer deposition (MLD), or other suitable methods. In some embodiments, before the etch stop layer 114 is formed, a buffer layer (not shown) may be further formed over the substrate 100. In an embodiment, the buffer layer is an oxide such as silicon oxide. However, other compositions may be possible. In some embodiments, the buffer layer is deposited using CVD, HDPCVD, SACVD, MLD, or other suitable methods.

Figure 2C:
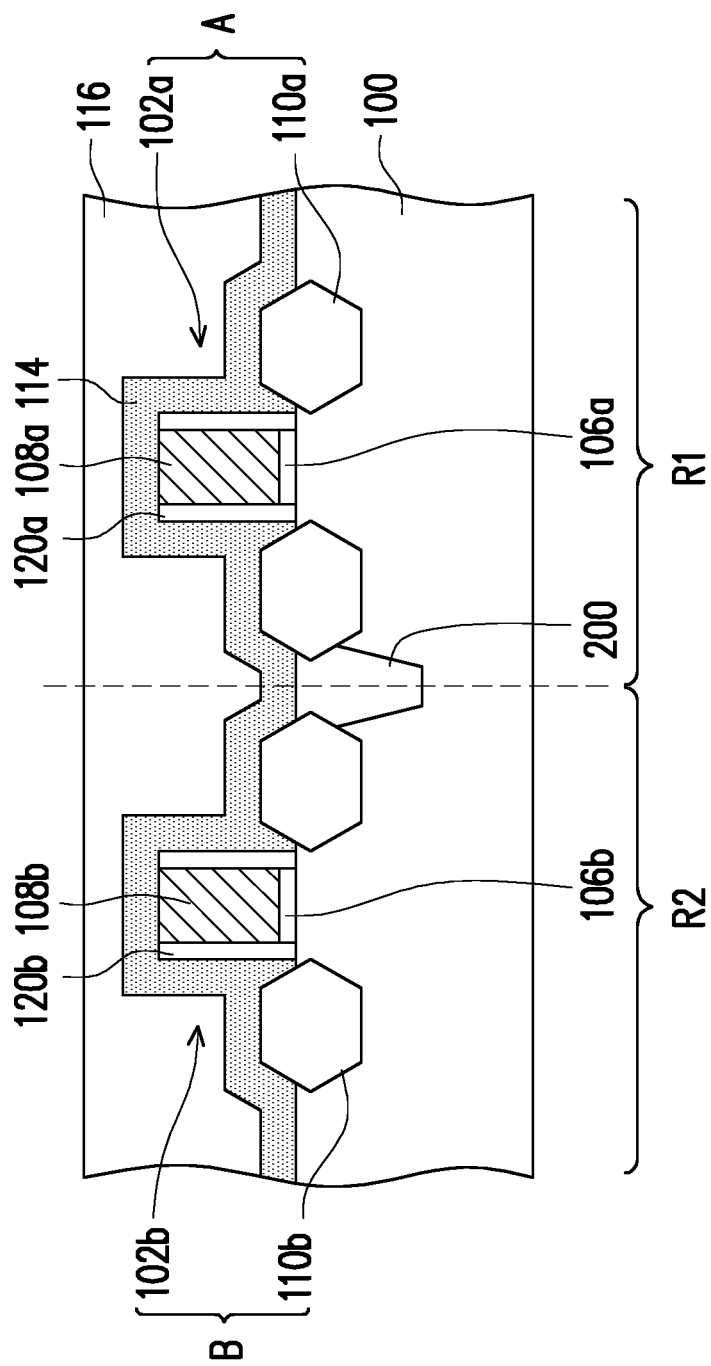

Referring to FIG. 1 and FIG. 2C, in step S003, a dielectric layer 116 is formed over the etch stop layer 116 and aside the first gate structure 102a and the second gate structure 102b. In some embodiments, the dielectric layer 116 is an interlayer dielectric layer (ILD). The dielectric layer 116 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 116 includes low-k dielectric materials. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 116 may include one or more dielectric materials and/or one or more dielectric layers. In some embodiments, the dielectric layer 116 is formed to a suitable thickness by Flowable CVD (FCVD), CVD, HDPCVD, SACVD, spin-on, sputtering, or other suitable methods.

Figure 2D:
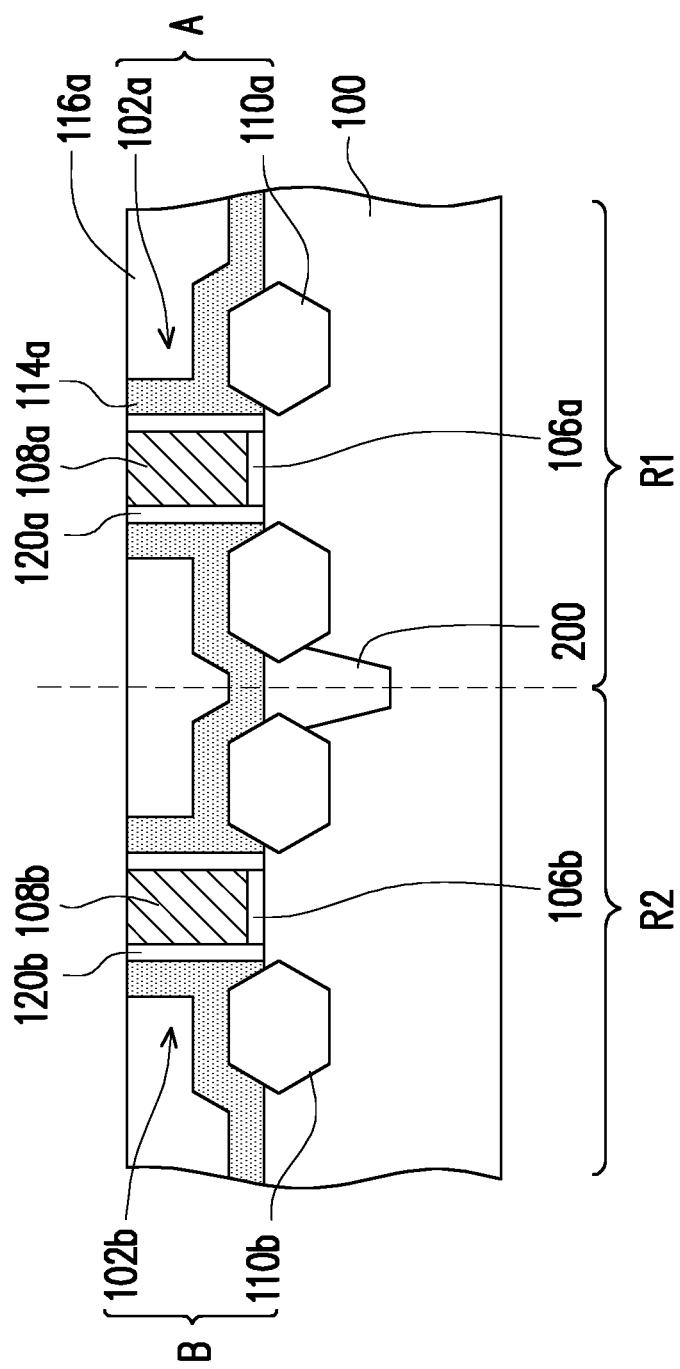

Referring to FIG. 1 and FIG. 2D simultaneously, in step S004, a portion of the dielectric layer 116 and a portion of the etch stop layer 114 are removed such that a top surface of the first gate electrode 108a and a top surface of the second gate electrode 108b are exposed. The process of removing the portion of the dielectric layer 116 and the portion of the etch stop layer 114 is achieved by a chemical mechanical polishing (CMP) process, an etching process, or other suitable process. As illustrated in FIG. 2D, after the removing process, the first spacers 120a and the etch stop layer 114a are between the dielectric layer 116a and the first gate electrode 108a. Similarly, the second spacers 120b and the etch stop layer 114a are between the dielectric layer 116a and the second gate electrode 108b.

Figure 2E:
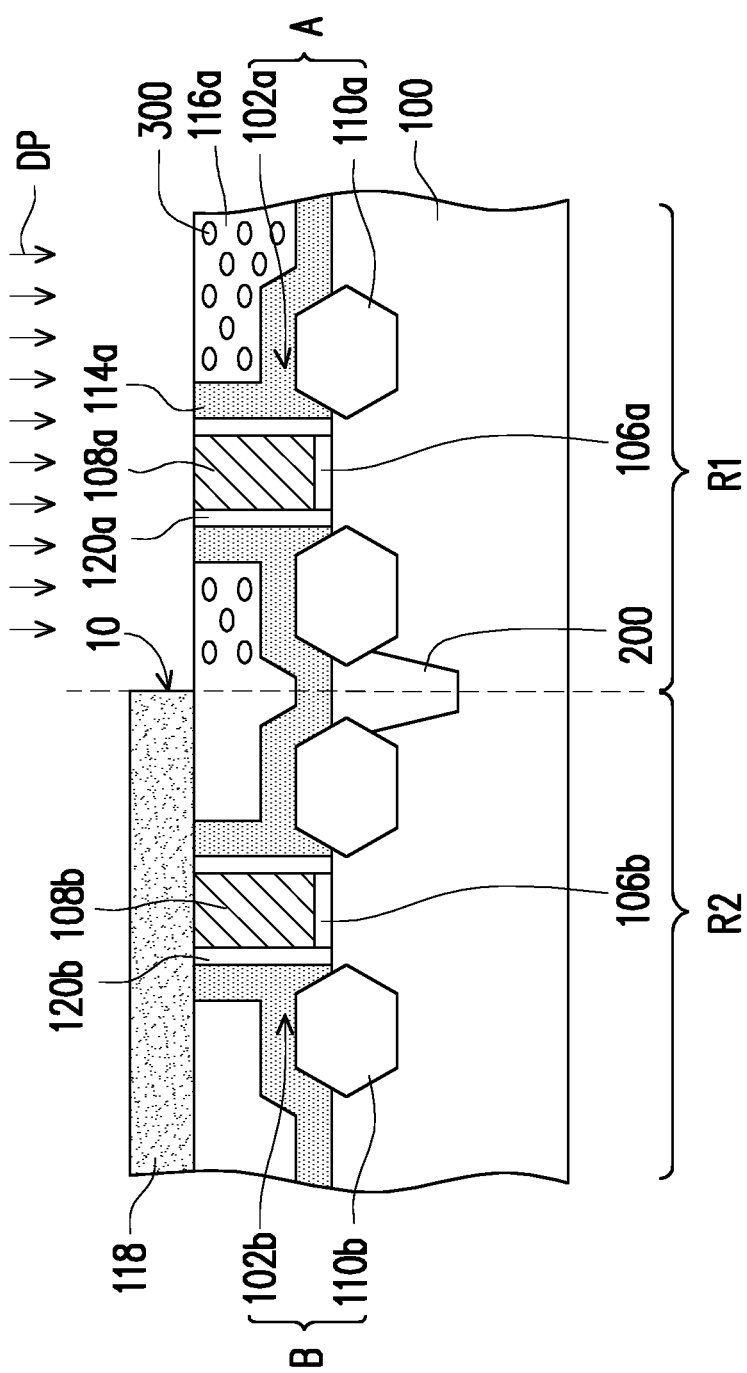

Referring to FIG. 1 and FIG. 2E, in step S005, a patterned mask layer 118 is formed over the substrate 100. In some embodiments, the patterned mask layer 118 is formed over the second region R2, and the second region R2 is an NMOS region, for example. Specifically, the patterned mask layer 118 overlays the second MOS transistor B, the etch stop layer 114a, and the dielectric layer 116a formed in the second region R2. On the other hand, the patterned mask layer 118 has an opening 10 which exposes the first region R1, and the first region R1 is a PMOS region. In other words, the patterned mask layer 118 exposes the first MOS transistor A, the etch stop layer 114a, and the dielectric layer 116a formed in the first region R1. The patterned mask layer 118 is formed using processes such as spin-coating a mask material layer, performing a photolithography processes to the mask material layer, etching off part of the mask material layer, and/or other processes. Specifically, the photolithography processes includes exposure, bake, and development. The patterned mask layer 118 is sensitive to a specific exposure beam such as KrF, ArF, EUV or e-beam light. For example, the mask material layer may be a photoresist made of a photosensitive resin or other suitable materials. In some embodiments, the mask material layer includes polymers, quencher, chromophore, solvent and/or chemical amplifier (CA).

Referring to FIG. 1 and FIG. 2E simultaneously, a doping process DP is performed subsequently, as shown in step S006. Specifically, the dielectric layer 116a is a strain material and would render high strain within the layer. As such, a strain modulator 300 may be introduced into the dielectric layer 116a to modulate a strain of the dielectric layer 116a. In detail, the strain modulator 300 may be a strain reducer, a strain enhancer, or other modulators to alter the lattice structure of the dielectric layer 116a. In some embodiments, the strain modulator 300 is doped into the dielectric layer 116a formed in the first region R1 to modulate the strain of the dielectric layer 116a. It should be noted that since the patterned mask layer 118 overlays the second region R2, the elements formed in the second region R2 are not being affected by the doping process DP. Under this circumstance, the strain modulator 300 is formed in the first region R1.

The strain modulator 300 may include suitable types of atom, molecule, and/or ion. In some embodiments, the strain modulator 300 is a tensile strain reducer. The addition of strain modulator 300 in the dielectric layer 116a affects a lattice constant larger than or equal to that of the original dielectric layer 116a, e.g., by changing, adjusting, or damaging the original lattice of the dielectric layer 116a, thus resulting in an effective lattice constant in the dielectric layer 116a. Thus, the strain in the dielectric layer 116a may be modulated due to the change, adjustment, or damage in lattice structure of the dielectric layer 116a. For example, the dielectric layer 116a may be a low-k material formed by FCVD, and the strain modulator 300 may be particles of suitable species that affect a larger lattice constant larger than an original lattice constant of the low-k dielectric material. In some embodiments, the strain modulator 300 includes an element of the Group IVA, an element of the Group VIIIA, or a combination thereof. In some exemplary embodiments, the strain modulator 300 includes silicon, germanium, xenon, or a combination thereof. In some embodiments, other suitable materials may be utilized as the strain modulator 300 of the present disclosure as long as the material is able to change, adjust, or damage the lattice of dielectric layer 116a.

The doping process DP is achieved by, for example, an ion implantation process (IMP). When an IMP process is adapted, an energy may be 10 KeV to 50 KeV, for example. In addition, a dosage of the strain modulator 300 ranges from $1 \times 10^{14}$ atom/cm$^2$ to $9 \times 10^{15}$ atom/cm$^2$, for example. In step S008, the patterned mask layer 118 is removed after the doping process DP is completed. The patterned mask layer 118 is removed through a dry stripping process, a wet stripping process, or other suitable processes.

Figure 2F:
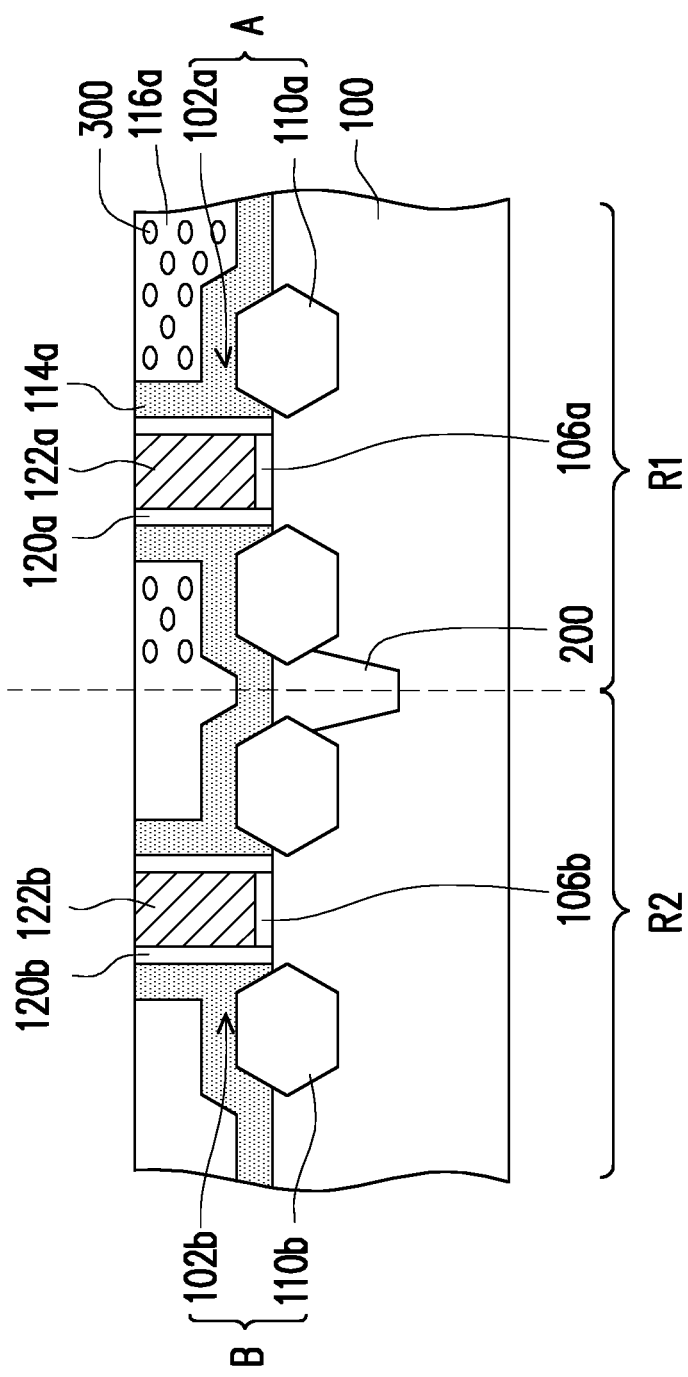

Referring to FIG. 1 and FIG. 2F simultaneously, in step S008, in some embodiments, the first gate electrode 108a and the second gate electrode 108b are dummy gate electrodes, and are being replaced respectively by a first gate electrode 122a and a second gate electrode 122b. Specifically, the material of the first gate electrode 108a and the second gate electrode 108b is polysilicon and the material of the firs gate electrode 122a and the second gate electrode 112b includes metal. In some embodiments, one of the first gate electrode 122a and second gate electrode 122b includes TiN, WN, TaN, or Ru for a PMOS device, and the other of the first gate electrode 122a and second gate electrode 122b includes Ti, Ag, Al, TiAl, TiAlN, TaC, TaCN, TaSiN, Mn, or Zr for an NMOS device. Moreover, the first gate electrode 122a and the second gate electrode 122b may further include a barrier, a work function layer, or a combination thereof. It should be noted that a liner layer, an interfacial layer, a seed layer, an adhesion layer, or a combination thereof may be further included between the first gate electrode 122a and the substrate 100 or/and between the second gate electrode 122b and the substrate 100.

In some embodiments, the first gate electrode 108a and the second gate electrode 108b are removed through an etching process or other suitable processes. On the other hand, the first gate electrode 122a and the second gate electrode 122b are formed by depositing a metal material (not shown) through suitable processes such as ALD, CVD, PVD, plating, or a combination thereof. After depositing the metal material, a portion of the metal material is removed to expose top surfaces of the first spacers 120a, the second spacers 120b, the etch stop layer 114a, and the dielectric layer 116a. For example, the firs gate electrode 122a and the second gate electrode 112b may have thicknesses in the range of about 30 nm to about 60 nm. The process of removing the portion of the metal material may be achieved by a chemical mechanical polishing (CMP) process, an etching process, or a combination thereof.

In some alternatively embodiments, the first gate dielectric layer 106a and the second gate dielectric layer 106b are removed together with the first gate electrode 108a and the second gate electrode 108b to form a gate trench. Subsequently, an interfacial layer (not shown), another gate oxide layer (not shown), and metal gate electrodes 122a, 122b are formed in the gate trench. For example, the interfacial layer may be used in order to create a good interface between the substrate 100 and the first gate dielectric layer 106a, as well as to suppress the mobility degradation of the channel carrier of the semiconductor device. Moreover, the interfacial layer is formed by a thermal oxidation process, a chemical vapor deposition (CVD) process, or an atomic layer deposition (ALD) process. A material of the interfacial layer includes a dielectric material, such as a silicon oxide layer or a silicon oxynitride layer.

Since the first and second gate electrodes 108a, 108b are being replaced by the first and second metallic gate electrodes 122a, 122b, subsequent process of forming metallic interconnection (not shown) can be implemented. For instance, other conductive lines (not shown) are formed to electrically connect the first gate electrodes 122a, 122b with other elements in the semiconductor device.

In some embodiments, the strain modulator 300 is doped into the dielectric layer 116a formed in the first region R1 to modulate the tensile strain of the dielectric layer 116a. As mentioned above, the first MOS transistor A formed in the first region R1 is a PMOS transistor, and thus by doping strain modulator 300 into the dielectric layer 116a formed in the first region R1, the tensile strain from the dielectric layer 116a in the PMOS region may be released. As such, the degradation in Ion/Ioff ratio of PMOS region can be suppressed, thereby enhancing the performance of the semiconductor device. For instance, an approximately 4% improvement of Ion/Ioff ratio is observed in a PMOS device having the strain modulator 300.

Figure 3A:
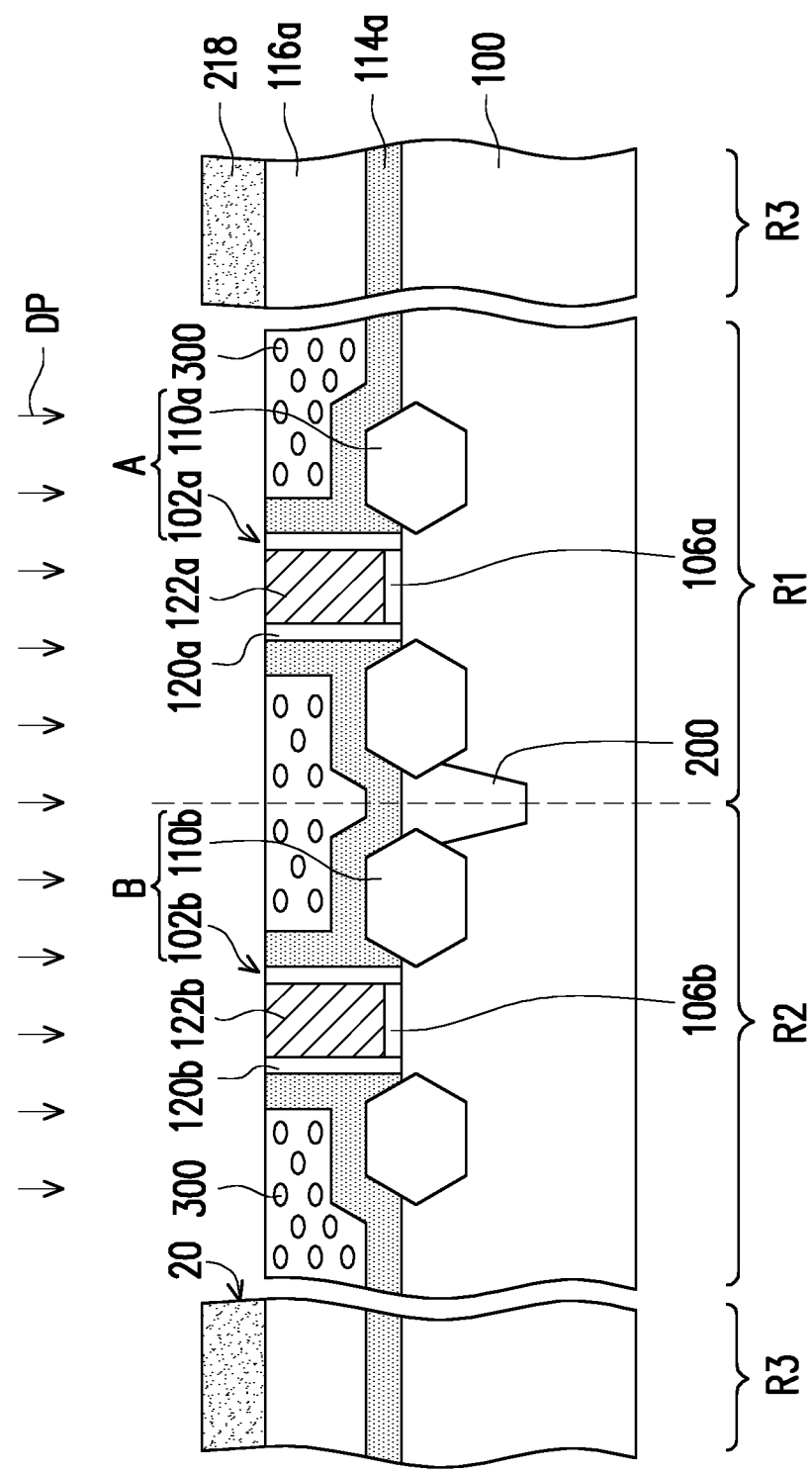
FIG. 3A through FIG. 3B are schematic cross-sectional views illustrating a manufacturing process of a semiconductor device according to second embodiment of the disclosure.
Figure 3B:
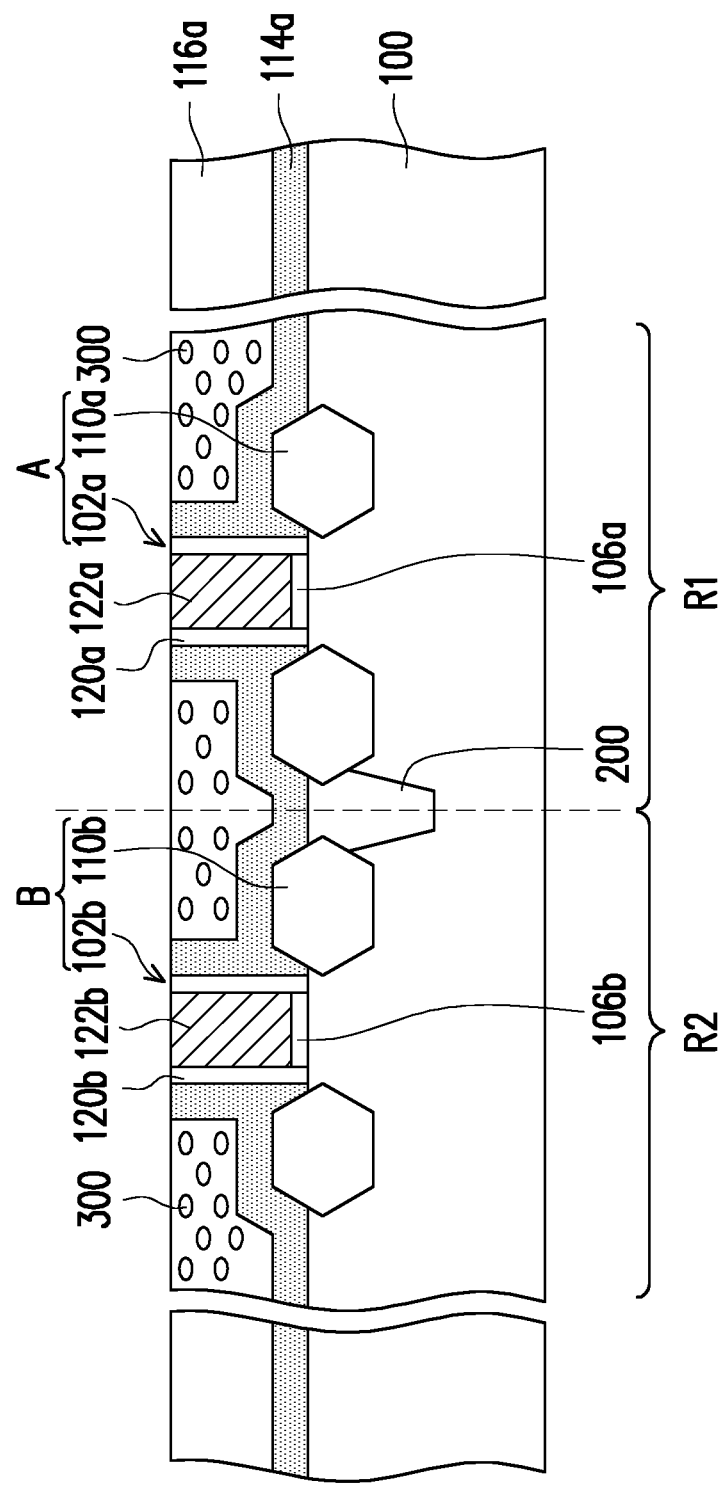

FIG. 3A through FIG. 3B are schematic cross-sectional views illustrating a manufacturing process of a semiconductor device according to second embodiment of the disclosure. The semiconductor device provided in the present embodiment is similar to the semiconductor device depicted in FIG. 2F, and therefore identical elements in these figures will be denoted with the same numerals and will not be further described hereinafter. The difference between the two embodiments respectively shown in FIG. 3B and FIG. 2F lies in that in the present embodiment, the strain modulator 300 is also found in the dielectric layer 116a formed in the second region R2. In other words, in some embodiment, a patterned mask layer 118 over the second region R2 is omitted. In alternative embodiments, a patterned mask layer 218 is formed over the substrate 100 (shown in FIG. 3A) in the third region R3. The patterned mask layer 218 has an opening 20 which exposes the first region R1 and the second region R2. In other words, the patterned mask layer 218 exposes the first MOS transistor A, the second MOS transistor B, the etch stop layer 114a, and the dielectric layer 116a formed in the first region R1 and the second region R2. Since the first region R1 and the second region R2 are not being shielded by the patterned mask layer 218, the strain modulator 300 is able to be doped into the entire dielectric layer 116 in the first region R1 and the second region R2 during the doping process DP (shown in FIG. 3B).

The above-mentioned embodiments in which the method of the disclosure is applied to a planar CMOS device, and are not construed as limiting the present disclosure. It is appreciated by people having ordinary skill in the art that the method of the disclosure can be applied to a FinFET device.

Figure 4A:
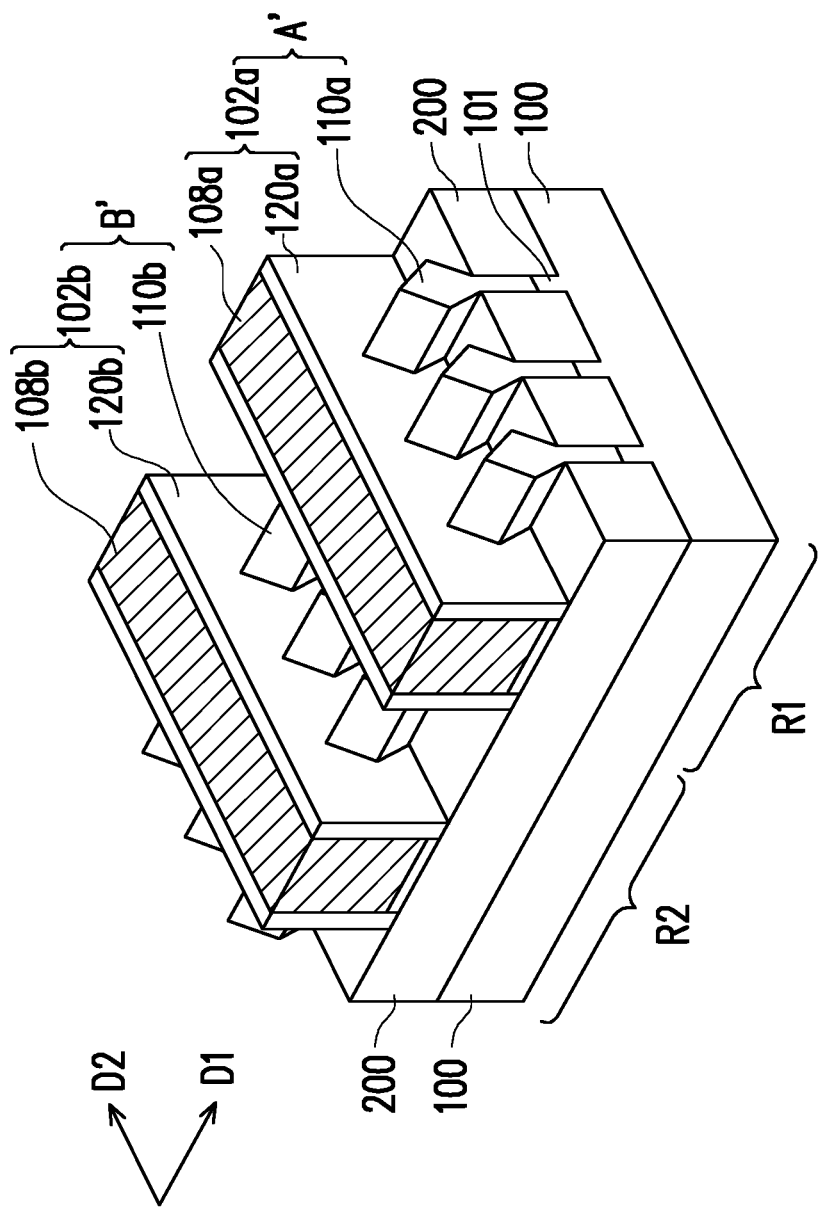
FIG. 4A through FIG. 4B are perspective views of a method for a manufacturing process of a semiconductor device according to third embodiment of the disclosure.
Figure 4B:
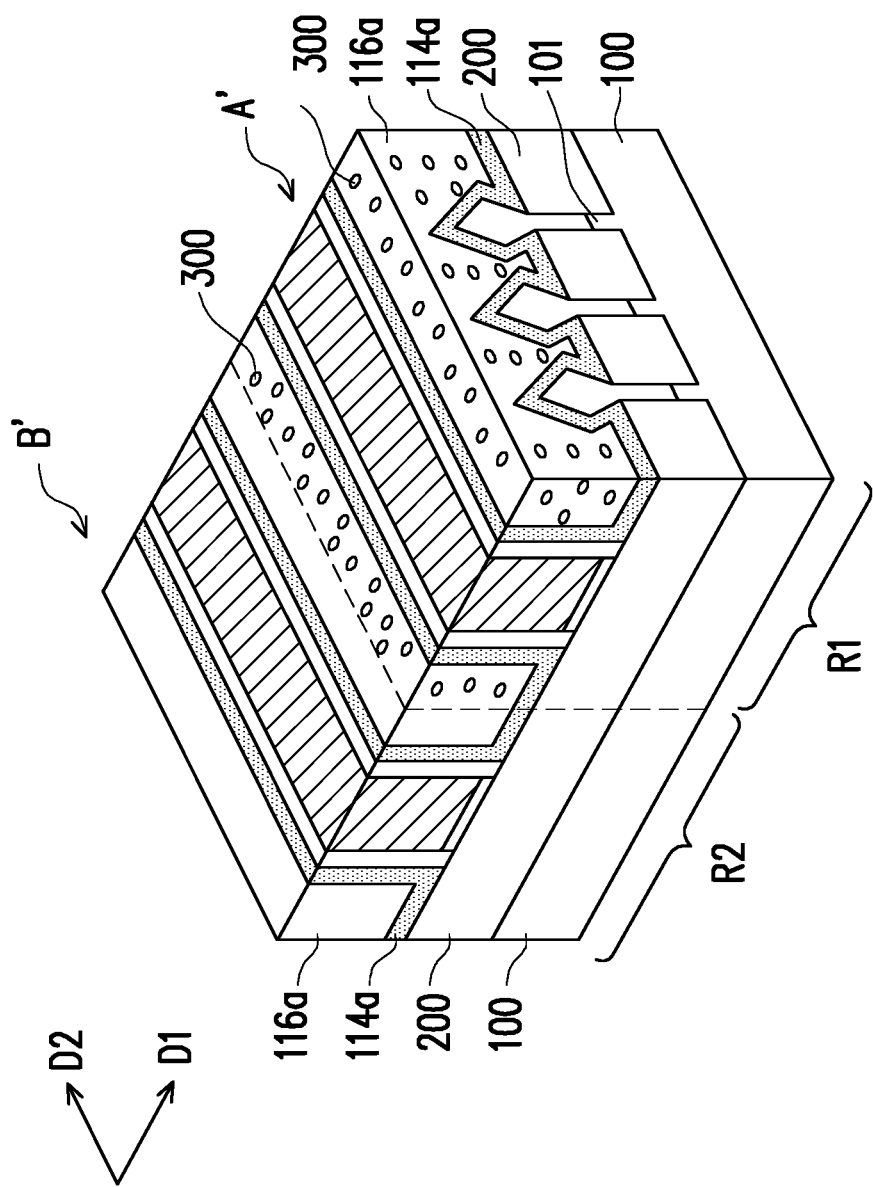

FIG. 4A through FIG. 4B are perspective views of a method for a manufacturing process of a semiconductor device according to third embodiment of the disclosure.

The semiconductor device provided in the third embodiment are similar to the semiconductor device depicted in FIG. 2F, and therefore identical elements in these figures will be denoted with the same numerals and will not be further described hereinafter. The difference between the two embodiments respectively shown in FIGS. 2A and 2F, and FIGS. 4A and 4B lies in that in the third embodiment, the semiconductor device includes a p-type FinFET A' and an n-type FinFET B'.

Referring to FIG. 4A and FIG. 4B, in the third embodiment, the substrate 100 is a substrate with fins 101 extending in a first direction D1. The first gate structure 102a and the second gate structure 102b are formed across the fins 101 and extend in a second direction D2 different from the first direction D1. The strain modulator 300 is doped into the dielectric layer 116a in the first region R1.

Figure 5:
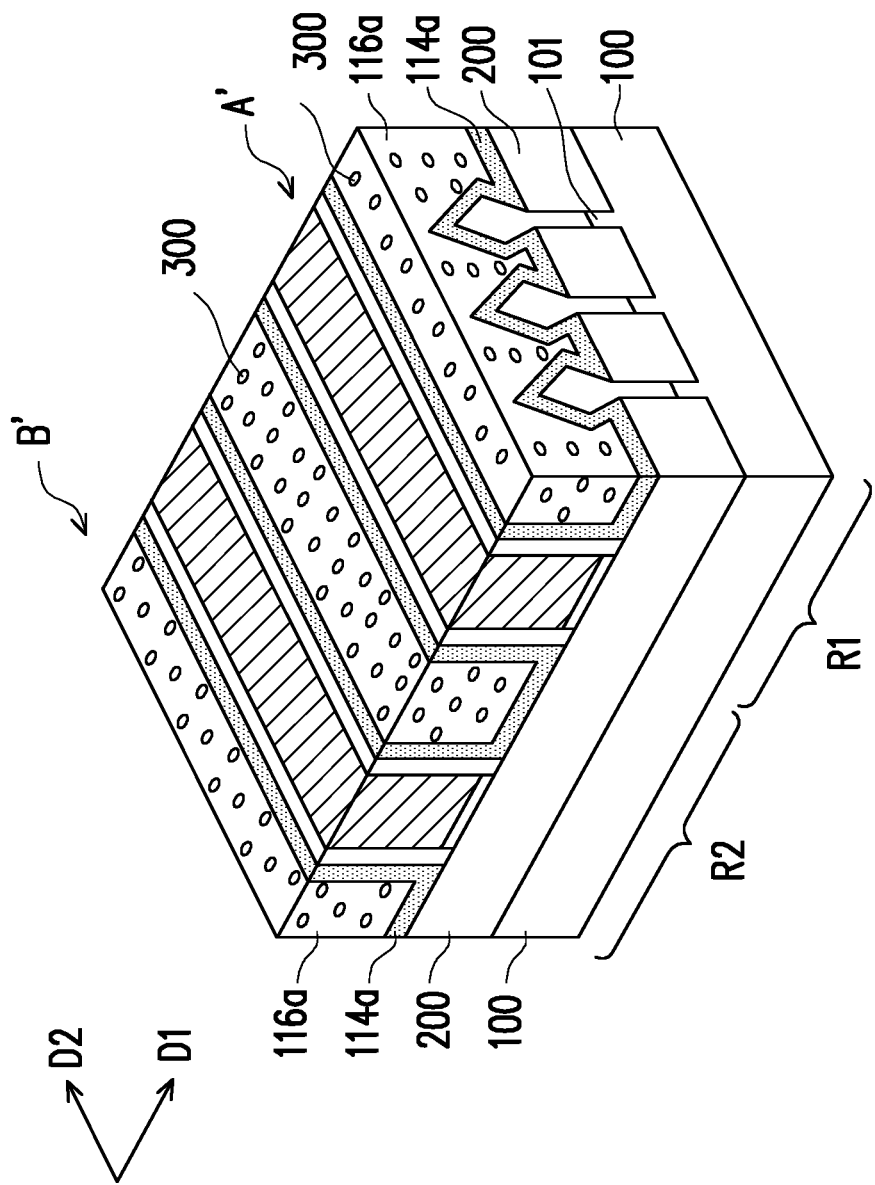
FIG. 5 is a perspective view of a semiconductor device according to fourth embodiment of the disclosure.

FIG. 5 is a perspective view of a semiconductor device according to fourth embodiment of the disclosure. The semiconductor device provided in the fourth embodiment are similar to the semiconductor device depicted in FIG. 4B, and therefore identical elements in these figures will be denoted with the same numerals and will not be further described hereinafter.

Referring to FIG. 5, the difference between the two embodiments respectively lies in that in the fourth embodiment, the strain modulator 300 is doped into the entire dielectric layer 116a in the first region R1 and the second region R2.

The present disclosure is not limited to applications in which the semiconductor device includes MOSFETs or FinFETs, and may be extended to other integrated circuit having a dynamic random access memory (DRAM) cell, a single electron transistor (SET), and/or other microelectronic devices (collectively referred to herein as microelectronic devices).

In the embodiments of the disclosure, the strain modulator is doped into the dielectric layer to modulate the tensile strain. As such, the tensile strain of the semiconductor device may be released and the degradation in Ion/Ioff ratio of the semiconductor device can be suppressed, thereby enhancing the performance of the semiconductor device.

In accordance with some embodiments of the present disclosure, a semiconductor device includes a substrate, a metal-oxide-semiconductor (MOS) transistor, and a dielectric layer. The MOS transistor includes a gate structure formed over the substrate. The dielectric layer is doped with a strain modulator, and thus the effective lattice constant of the dielectric layer becomes different from an original lattice constant of the dielectric layer prior to doping. The strain modulator at least comprises silicon.

In accordance with alternative embodiments of the present disclosure, a semiconductor device includes a substrate, a p-type FinFET, an n-type FinFET, and a dielectric layer. The substrate has a first region and a second region. The p-type FinFET is formed in the first region and includes a first gate structure formed over the substrate. The n-type FinFET is formed in the second region and includes a second gate structure formed over the substrate. The dielectric layer is formed aside the first gate structure and the second gate structure, and at least part of the dielectric layer in the first region includes a strain modulator. In some embodiments, an effective lattice constant in certain part (e.g., regions) of the dielectric layer that includes the strain modulator is different from an effective lattice constant in part of the dielectric layer that does not include the strain modulator.

In accordance with yet alternative embodiments of the present disclosure, a semiconductor includes a substrate, a first MOS transistor, a second MOS transistor, a dielectric layer and an etch stop layer. The substrate has a first region, a second region and a third region. The first MOS transistor is in the first region, and comprises a first gate structure formed over the substrate. The second MOS transistor is in the second region, and comprises a second gate structure formed over the substrate. The dielectric layer is aside the first gate structure and the second gate structure. A portion of the dielectric layer comprises a strain modulator. The etch stop layer is over the substrate. The etch stop layer is between the first gate structure and the dielectric layer, and between the second gate structure and the dielectric layer. The etch stop layer is in contact with a top surface of the substrate between a spacer of the first gate structure of the first MOS transistor and a doped source and drain region of the first MOS transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a metal-oxide-semiconductor (MOS) transistor, wherein the MOS transistor comprises a gate structure formed over a substrate; and
a dielectric layer formed aside the gate structure, wherein the dielectric layer is doped with a strain modulator, and an effective lattice constant of the dielectric layer doped with the strain modulator is different from an original lattice constant of the dielectric layer prior to be doped with the strain modulator, wherein the strain modulator at least comprises silicon,
wherein a top surface of the dielectric layer is coplanar with a top surface of the gate structure.

2. The semiconductor device according to claim 1, wherein the strain modulator further comprises another element of the Group IVA except silicon, an element of the VIIIA group or a combination thereof.

3. The semiconductor device according to claim 1, wherein the strain modulator further comprises germanium, xenon, or a combination thereof.

4. The semiconductor device according to claim 1, wherein the dielectric layer comprises a low-k dielectric material having a dielectric constant lower than 3.9.

5. The semiconductor device according to claim 1, further comprising an etch stop layer between the dielectric layer and the gate structure.

6. The semiconductor device according to claim 1, wherein the MOS transistor comprises a p-type channel metal-oxide-semiconductor field effect transistor.

7. A semiconductor device, comprising:
a substrate, having a first region and a second region;
a p-type fin-type field effect transistor (FinFET) formed in the first region, wherein the p-type FinFET comprises a first gate structure formed over the substrate;
an n-type FinFET formed in the second region, wherein the n-type FinFET comprises a second gate structure formed over the substrate; and
a dielectric layer formed aside the first gate structure and the second gate structure, wherein at least part of the dielectric layer in the first region comprises a strain modulator, and an effective lattice constant in the at least part of the dielectric layer that comprises the strain modulator is different from an effective lattice constant in part of the dielectric layer that does not comprise the strain modulator.

8. The semiconductor device according to claim 7, wherein the strain modulator comprises an element of the Group IVA, an element of the VIIIA group or a combination thereof.

9. The semiconductor device according to claim 7, wherein the strain modulator comprises silicon, germanium, xenon, or a combination thereof.

10. The semiconductor device according to claim 7, wherein the dielectric layer formed in the first region comprises a low-k dielectric material having a dielectric constant lower than 3.9.

11. The semiconductor device according to claim 7, wherein the dielectric layer formed in the first region and the second region comprises the strain modulator.

12. A semiconductor device, comprising:
a substrate, having a first region, a second region and a third region;
a first metal-oxide-semiconductor (MOS) transistor in the first region, wherein the first MOS transistor comprises a first gate structure formed over the substrate;
a second MOS transistor in the second region, wherein the second MOS transistor comprises a second gate structure formed over the substrate;
a dielectric layer aside the first gate structure and the second gate structure, wherein a portion of the dielectric layer comprises a strain modulator;
an etch stop layer over the substrate, wherein the etch stop layer is between the first gate structure and the dielectric layer, and between the second gate structure and the dielectric layer, wherein the etch stop layer is in contact with a top surface of the substrate between a spacer of the first gate structure of the first MOS transistor and a doped source and drain region of the first MOS transistor,
wherein a top surface of the dielectric layer is coplanar with a top surface of the first gate structure.

13. The semiconductor device of claim 12, wherein an effective lattice constant in the portion of the dielectric layer that comprises the strain modulator is different from an effective lattice constant in part of the dielectric layer that does not comprise the strain modulator.

14. The semiconductor device of claim 13, wherein the strain modulator at least comprises silicon.

15. The semiconductor device of claim 14, wherein the strain modulator further comprises another element of the Group IVA except silicon, an element of the VIIIA group or a combination thereof.

16. The semiconductor device of claim 14, wherein the strain modulator further comprises germanium, xenon, or a combination thereof.

17. The semiconductor device of claim 12, wherein the dielectric layer comprises a low-k dielectric material having a dielectric constant lower than 3.9.

18. The semiconductor device of claim 12, wherein the strain modulator is comprised in the dielectric layer in the first region, and not comprised in the dielectric layer in the second region and the third region.

19. The semiconductor device of claim 12, wherein the strain modulator is comprised in the dielectric layer in the first region and the second region, and not comprised in the dielectric layer in the third region.

20. The semiconductor device of claim 12, wherein the first MOS transistor and the second MOS transistor are planar MOS field effect transistor or fin-type field effect transistor.

* * * * *